United States Patent [19]

Michoff

[11] 4,416,023

[45] Nov. 15, 1983

[54] STRONG AND WEAK SIGNAL PREAMPLIFICATION SYSTEM

[76] Inventor: John C. Michoff, 8999 Field Rd., Algonac, Mich. 48001

[21] Appl. No.: 112,944

[22] Filed: Jan. 17, 1980

[51] Int. Cl.³ .............................................. H04B 1/16
[52] U.S. Cl. .................................. 455/291; 455/276; 455/217
[58] Field of Search ............... 455/291, 296, 289, 286, 455/249, 280, 276, 308, 232, 234, 250, 251, 217, 1.31; 343/850, 854

[56] References Cited

U.S. PATENT DOCUMENTS

| | | | |
|---|---|---|---|
| 2,531,935 | 11/1950 | Doeiz | 455/295 |
| 3,108,225 | 10/1963 | Midkiff | 455/289 |
| 3,199,029 | 8/1965 | Laurent | 455/289 |
| 3,619,786 | 11/1971 | Wilcox | 455/249 |
| 3,805,164 | 4/1974 | Callaway | 455/291 |
| 3,824,473 | 7/1974 | Pye | 455/291 |
| 4,158,814 | 6/1970 | Imazeki | 455/217 |

*Primary Examiner*—Tommy P. Chin
*Attorney, Agent, or Firm*—Remy J. VanOphem

[57] ABSTRACT

In a television receiver system having an antenna and a preamplifier, the antenna is chosen to receive signals from distant stations. Weak signals are amplified and applied to the receiver through an adjustable attenuator. Strong signals from near stations are held to a maximum level before amplification and before application to the receiver through the adjustable attenuator. Manual adjustment of the attenuator enables the viewer to adjust the signal to optimize the television picture.

20 Claims, 3 Drawing Figures

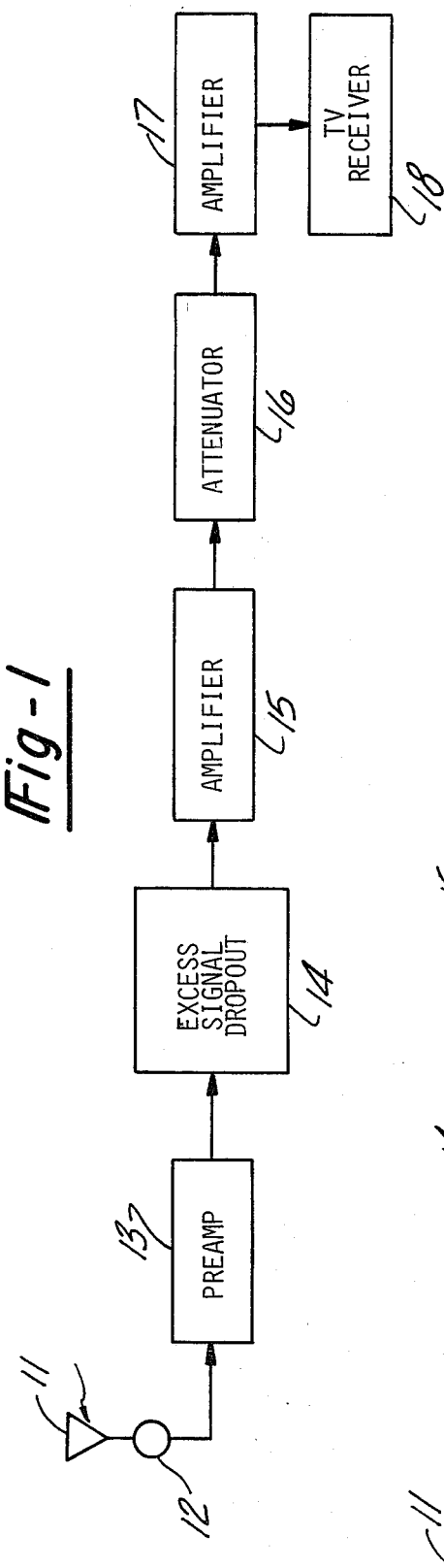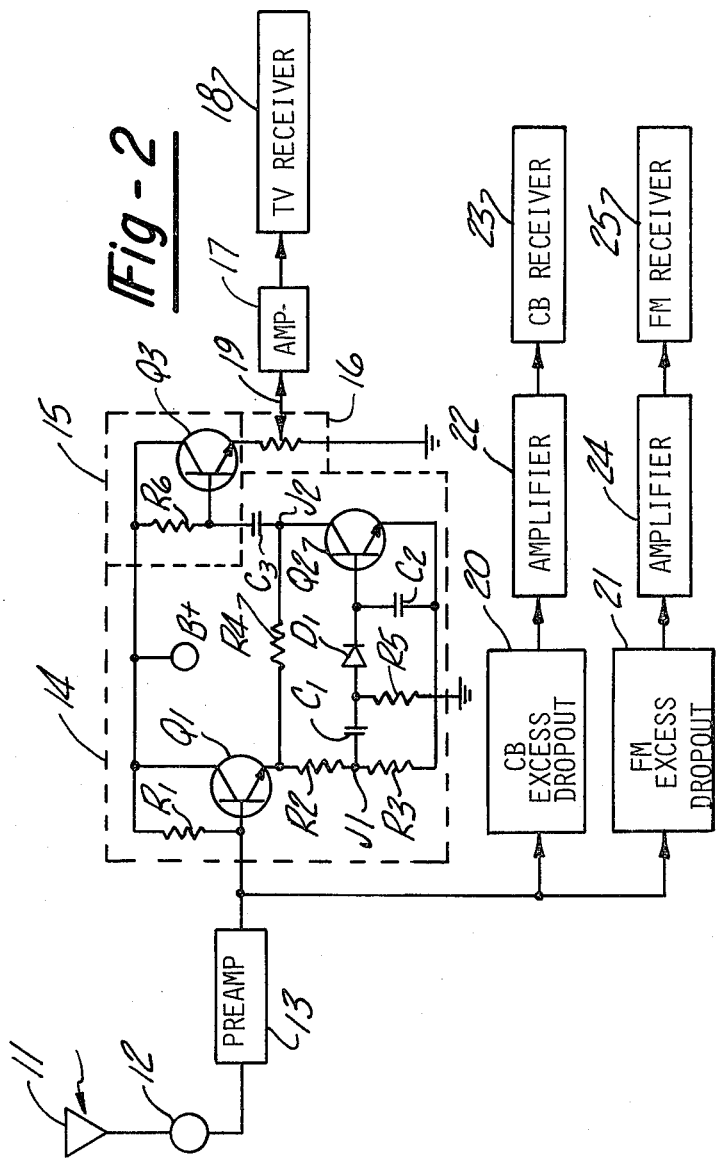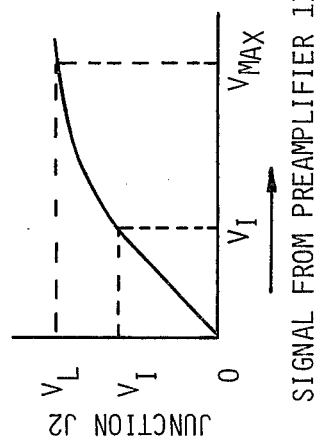

STRONG AND WEAK SIGNAL PREAMPLIFICATION SYSTEM

BACKGROUND OF THE INVENTION

The quality of a television picture depends upon the reception of an input signal from the antenna having a value within predetermined limits. Television receivers are normally designed with automatic gain control circuits such as taught by Leland in U.S. Pat. No. 3,622,891 which detune one or more of the input stages to keep the subsequent amplification stages of the receiver from saturating in the presence of a strong input signal. Alternately, as taught by Wilcox in U.S. Pat. No. 3,619,786, the receiver may include one or more attenuators which attenuate the received signal in response to an automatic gain control signal. The function of these circuits, as well as others known in the art, is to maintain the received television signal within the predetermined limits.

As the distance between the transmitter and receiver increases, the signals received by the receiver become weaker. High gain television antennas have been developed to extend the distance over which a satisfactory picture can be obtained. Unfortunately, these high gain antennas are highly directional and the antenna must be pointed in the direction of the transmitter to achieve the desired gain. To overcome this problem, rotor mechanisms, such as disclosed by Jordan in U.S. Pat. No. 2,498,957 have been developed which permit the operator to point the high gain antenna in the direction of the transmitter.

This combination works well when the transmitter is located relatively far from the receiver; however, when a transmitter is relatively close, the received signal may exceed the predetermined limits of the television receiver and cause the input stage of the receiver to be overpowerd distorting the received signal and, therefore, the picture. This problem can often be overcome by rotating the antenna away from the transmitter, decreasing the gain of the antenna, or by attenuating the received signal as taught by Cuvilliez in U.S. Pat. No. 2,654,030. Rotating the antenna away from the transmitter is generally unsatisfactory since more often than not, it results in ghost images produced by signals reflected from objects located along the path in which the antenna is pointed. Alternately, Cuvilliez teaches a five position switch to control the strength of the received signal at the input of the receiver. In the first position, the signal from the antenna is applied to the input of the receiver in a normal manner. The second position merely reverses the input leads from the antenna to the receiver. The third position inserts an impedance in series with the antenna leads to attenuate the signal strength. The fourth position disconnects the antenna from the receiver so that the signal is received only by the lead wires connecting the control to the receiver. The fifth position grounds the leads at the controller so that the received signal is a ground signal. This permits the operator to compensate for the strength of the received signal by switching the control from one position to another.

Preamplifiers have been developed to increase the reception range of receivers over that normally obtained by a high gain antenna. The preamplifier raises the signal level of very weak signals to within the predetermined limits of the receiver. This technique works well when receiving signals from distant stations but suffers a major disadvantage when the receiver antenna is close to the transmitter. In this instance, the preamplified signal is too strong and the subsequent amplification stages of the receiver are overdriven, thereby causing a "grassy" or discolored picture.

For this reason, some efforts have been made at utilizing two antennas for a single television receiver. In such a system, one large antenna is used to receive signals from the distant transmitting stations and a different smaller antenna is used to receive signals from the closer television stations. Then according to the distance of the television transmitter from which reception is desired, the operator selects one of the two antennas by way of a switch located in the proximity of the television set. Such a system offers some improvement over a single antenna combined with a preamplification system but suffers a substantial disadvantage in that frequently the two antennas will reflect signals to one another so that an optimum picture is not received while either antenna is in use.

SUMMARY OF THE INVENTION

The invention is a preamplifier for a receiver, such as a television receiver, capable of limiting the signals from near stations. Weak signals are amplified and applied to the receiver through an attenuator. Strong signals from near stations are limited to a maximum level and applied to the receiver through the attenuator. Adjustment of the attenuator by the viewer enable the viewer to adjust the signal applied to the receiver to optimize the television picture.

BRIEF DESCRIPTION OF THE DRAWINGS

FIG. 1 is a block diagram of a preferred embodiment of the invention;

FIG. 2 is a block diagram very similar to the block diagram of FIG. 1 but showing in more detail some of the structural features of the preferred embodiment; and FIG. 3 is a graph showing the magnitude of the signal from the dropout circuit as a function of the input signal from the preamplifier.

DETAILED DESCRIPTION OF THE PREFERRED EMBODIMENT

The preferred embodiment shown in FIG. 1 includes an antenna 11 which is used to receive signals from transmitting stations. Any of the well known types of antenna can be used but a UHF-VHF combination type, ultra-fringe antenna is preferred. Coupled to the antenna 11 is a motor 12 which is used to rotate the antenna toward the desired station to maximize the received signal. As is known, this motor can be either a stepping motor or a standard servo type motor.

The output of the antenna 11 is coupld to a preamplifier 13 which is used to amplify the received signal. When the received signal is weak or below a predetermined level, the preamplifier works as desired and causes no deleterious effects upon the television picture. However, in order to have the receiver respond to signals from distant stations, that is, respond to weak signals, the preamplifier must be designed for a relatively high level of amplification. For this reason, when strong signals are received from near stations, the preamplifier itself overloads and its output signal also overloads the amplifying circuits built into the television receiver 18 causing grassy and otherwise unacceptable pictures.

This problem is overcome by inserting a signal level responsive means or excess signal dropout circuit 14 between the preamplifier 13 and an amplifier 15. The excess signal dropout circuit 14 is a solid state device which is voltage sensitive so that below a predetermined voltage, the received signal is passed through without alteration and applied to the input of te amplifier 15. However, when the predetermined signal stength is exceeded, the excess signal dropout circuit 14 actuates and limits the signal applied to the amplifier 15. With the input signal to the amplifier 15 limited to the maximum predetermined value, the amplification circuits within the television receiver 18 are never driven to saturation and, therefore, do not degrade the television picture.

An attenuator 16 receives the output signal of the amplifier 15 and the output signal of the attenuator is applied to the television receiver 18 through an optional amplifier 17. The attenuator 16 is manually adjustable and is located in the proximity of the receiver so that the viewer can adjust the attenuator at will. Upon selecting the desired channel on the television receiver, and typically by rotating the antenna motor 12 so that the antenna 11 faces in the desired direction, the viewer can then tune the television picture to the optimum simply by manually adjusting a slide 19 or similar control of the attenuator 16. In this manner, the signal applied to the television receiver 18 from the amplifier 15 is optimized irrespective of the distance between the transmitting station and the television receiver 18.

FIG. 2 is similar to the embodiment shown in FIG. 1 but shows the excess signal dropout circuit 14, the amplifier 15 and the attenuator 16 in more detail. The excess signal dropout circuit 14, as shown, includes a first transistor $Q_1$, the base of which receives the output of the preamplifier 13 and is connected to a source of electrical power, designated by the terminal B+, by means of a resistance $R_1$. The collector of $Q_1$ is connected directly to B+ while its emitter is connected to a common ground through serially connected resistances $R_2$ and $R_3$. The emitter is also connected to ground through a resistance $R_4$ and the collector-emitter electrodes of a transistor $Q_2$. The emitter of the transistor $Q_2$ is also connected to the common ground. The base of the transistor $Q_2$ is connected to a junction $J_1$ between resistances $R_2$ and $R_3$ through a capacitance $C_1$ and a diode $D_1$. A resistance $R_5$ connects the junction between the capacitance $C_1$ and the diode $D_1$ to the common ground. A filter capacitance $C_2$ is connected between the base of the transistor $Q_2$ and the common ground.

The amplifier 15 includes a transistor $Q_3$ having its base connected to B+ through a resistance $R_6$ and to a junction $J_2$ between the resistance $R_4$ and the collector of the transistor $Q_2$ through a capacitance $C_3$. The collector of the transistor $Q_3$ is connected directly to B+ while its emitter is connected to the common ground through the attenuator 16.

The operation of the excess signal dropout circuit 14 is as follows: The transistor $Q_1$ functions as a unity gain amplifier, and the signal generated at the junction between the resistances $R_2$ and $R_4$ and the emitter of the transistor $Q_1$ is approximately equal to the signal received from the preamplifier 13. The resistances $R_2$ and $R_3$ form a voltage divider producing a signal of reduced magnitude at their junction $J_1$. The capacitances $C_1$ and $C_2$, the diode $D_1$ and the resistance $R_5$ filter and rectify the A.C. component of the signal appearing at the junction $J_1$ between the resistances $R_2$ and $R_3$ to produce a D.C. signal having a magnitude directly proportional to the signal appearing at the junction $J_1$. This D.C. signal is applied to the base of the transistor $Q_2$.

As the magnitude of the signal received from the preamplifier 13 increases, the D.C. signal applied to the base of the transistor $Q_2$ increases. The signal applied to the base of the transistor $Q_2$ controls its conductance.

The resistance $R_4$ and the transistor $Q_2$ form a second voltage divider such that the signal appearing at the junction $J_2$ between the resistance $R_4$ and the collector of the transistor $Q_2$ is inversely proportional to the signal applied to the base of the transistor $Q_2$. Using circuit analysis methods well known to those skilled in designing electrical circuits, the values of the resistances $R_2$, $R_3$, and $R_4$ and the conductance characteristics of the transistor $Q_2$ can be determined such that the magnitude of the signal appearing at the junction $J_2$ will change as a function of the magnitude of the signal received from the preamplifier 13 as shown on FIG. 3.

As shown on FIG. 3, when the magnitude of the signal received from the preamplifier 13 is below a value designated $V_1$, the conductance of the transistor $Q_2$ is small and its effective resistance is large compared to the value of the resistance $R_4$. Therefore, when the magnitude of the signal received from the preamplifier 13 is below $V_1$, the signal appearing at the junction $J_2$ is approximately equal to the received signal. In the range from $V_1$ to V Max, where V Max is the magnitude of the maximum output of the preamplifier 13, the effective resistance of the transistor $Q_2$ forms an effective voltage divider. In this range, the signal at the junction $J_2$ ceases to be directly proportional to the signal received from the preamplifier 13. As the conductance of the transistor $Q_2$ increases, with increases in the magnitude of the signal received from the preamplifier 13, the signal at the junction $J_2$ approaches a limiting value $V_L$ as shown.

The signal appearing at the junction $J_2$ is applied to the base of the transistor $Q_3$ through the capacitance $C_3$. The transistor $Q_3$ also functions as a unity gain amplifier. Therefore, when the signal received from the preamplifier 13 is below $V_1$, the signal generated by the transistor $Q_3$ is substantially the same as the received signal. As the signal received from the preamplifier 13 exceeds $V_1$ the signal applied to the base of the transistor $Q_3$ from the junction $J_2$ is attenuated as previously described. Therefore, the output signal from the amplifier 15 is limited to the value $V_L$ determined by the excess signal dropout circuit 14. The circuit illustrated on FIG. 2 is shown by way of example only as other voltage responsive devices also can be used to limit the signal level. The two transistors $Q_1$ and $Q_2$, respectively, and their circuits are shown by way of example only as other voltage responsive devices also can be used to limit the signal level.

The attenuator 16 is shown as a simple resistance rheostat having a slide 19 which is used to slide up and down a resistance element and thereby vary the input signal applied to the optional amplifier 17 or directly to the television receiver 18. However, the attenuator 16 can be any of the many types of attenuators available in the art and need not be a resistance element of the type shown. The presence of the attenuator 16, which is located in the proximity of the television receiver 18, has several advantages. When a weak signal is received from the antenna 11, although the preamplifier 13 and the amplifiers 15 and 17 substantially increase the strength of the weak signal, the viewer can maximize the signal received by the television receiver simply by moving the slide to the position where the maximum input is provided to the television receiver 18. Alternatively, when an exceptionally strong signal is received, and although this signal is limited by the excess signal dropout circuit 14, the viewer may prefer to further decrease the signal. Such a decrease can be effected simply by operating the slide arm 19 of the attenuator 16 to thereby optimize the television picture to a viewer's preferred specifications.

FIG. 2 shows a CB excess signal dropout circuit 20 coupled to the output of the preamplifier 13. The preamplifier 13 cab be made to have a sufficiently broad bandpass so that the antenna 11 and the preamplifier 13 can also be used for citizens band (CB) and frequency modulation (FM) reception. FIG. 2, therefore, also shows a FM excess signal dropout circuit 21.

Both of the excess signal dropout circuits 20 and 21 can be constructed in the same manner as the excess signal dropout circuit 14. Also, the CB excess signal dropout circuit 20 is coupled to a CB receiver 23 through an amplifier 22. In a similar manner, the FM excess signal dropout circuit 21 is coupled to a FM receiver 25 through an amplifier 24. It will be apparent to those skilled in the art that if desired the CB dropout circuit 20 and the FM dropout circuit 21 can be coupled to the antenna 11 through additional preamplifiers which are individually designed preamplifiers.

It will also be apparent to those skilled in the art that the CB excess signal dropout circuit 20 and FM excess signal dropout circuit 21 can further enhance the quality of the television signal appearing at the television receiver 18 by its lack of presence, thus eliminating CB or FM interference patterns at the television receiver 18.

What I claim is:

1. A preamplifier connectable between an antenna producing an output signal in response to signals received from local and distant transmitting stations and an input to a receiver capable of producing an undistorted output in response to receiving input signals between predetermined input signal levels of said receiver, said preamplifier comprising:
   preamplification means for amplifying the level of said output signal of the antenna in response to the signals received from said local and distant transmitting stations to generate an amplified signal;
   signal level responsive means responsive to the amplitude of said amplified signal for limiting the amplitude of said amplified signal to less than a predetermined maximum amplitude to generate a limited signal; and
   signal attenuator means for attenuating the amplitude of said limited signal to generate an input signal for said receiver having a signal level within the predetermined input signal levels of said receiver.

2. The preamplifier of claim 1 wherein said signal attenuator means is manually operable.

3. The preamplifier of claim 1 wherein said signal level responsive means further comprises amplifier means between said signal attenuator means and said signal level responsive means.

4. The preamplifier of claim 1 wherein said signal level further comprises amplifier means between said signal attenuator means and said receiver.

5. The preamplifier of claim 1 wherein said signal level responsive means comprises:
   a voltage divider for generating a signal proportional to the output voltage of said preamplification means;
   means for rectifying said signal proportional to said output voltage of said preamplification means to generate a D.C. bias signal;
   a resistance and a transistor serially connected to said output of said preamplification means and in parallel with said voltage divider, said transistor receiving said D.C. bias signal at a base electrode varying the resistance of said transistor in proportion to the value of said D.C. bias signal; and
   a capacitance connecting the junction between said resistance and said transistor to an input of said signal attenuator means.

6. The preamplifier of claim 1 wherein there are at least two of said signal level responsive means and signal attenuator means.

7. The preamplifier of claim 6 wherein said receiver includes a television receiver connected to one of said at least two signal attenuator means and a citizens band receiver connected to the other of said at least two signal attenuator means.

8. The preamplifier of claim 1 wherein said signal level responsive means passes approximately unattenuated signals having an amplitude below a predetermined amplitude value, said predetermined amplitude value being below said predetermined maximum amplitude, and further wherein said signal level responsive means attenuates signals having an amplitude level above said predetermined amplitude value to a value not exceeding said predetermined maximum amplitude.

9. The preamplifier of claim 5 further comprising first amplifier means between said capacitance and said signal attenuator means.

10. The preamplifier of claim 9 further comprising second amplifier means between said signal attenuator means and said receiver.

11. The preamplifier of claim 5 wherein said signal level responsive means passes approximately unattenuated signals having an amplitude below a predetermined amplitude value, said predetermined amplitude value being below said predetermined maximum amplitude, and further wherein said signal level responsive means attenuates signals having an amplitude level above said predetermined amplitude value to a value not exceeding said predetermined maximum amplitude.

12. The preamplifier of claim 7 further comprising amplifier means between said capacitance and said signal attenuator means.

13. In combination with a receiving system having an antenna receiving radio and television signals, a preamplifier amplifying the signals received by said antenna and a receiver utilizing the amplified signals, a signal limiter connectable between said preamplifier and said receiver for limiting the ampified signal to within predetermined distortion free input signal levels of said receiver, said signal limiter comprising:
   signal limiting means for limiting the signals received from said preamplifier to a voltage value not to exceed a predetermined maximum voltage value; and
   attenuator means having its output connected to said receiver for attenuating the signals received from said signal limiting means to within said predetermined distortion free input signal levels of said receiver.

14. The signal limiter of claim 13 wherein said attenuator means is manually operable.

15. The signal limiter of claim 14 wherein said signal limiting means is a voltage sensitive device which limits the voltage value of the output signal thereof to said predetermined maximum voltage value.

16. The signal limiter of claim 15 wherein said voltage sensitive device passes approximately unattenuated signals having a voltage value below a predetermined voltage value, said predetermined voltage value being below said predetermined maximum voltage value, and further wherein said voltage sensitive device attenuates signals having a voltage value above said predetermined voltage value to a value not exceeding said predetermined maximum voltage value.

17. The signal limiter of claim 16 wherein said signal limiting means comprises:
 a voltage divider for generating a signal proportional to the output voltage of said preamplifier;
 means for rectifying said signal proportional to the output voltage of said preamplifier to generate a D.C. bias signal;
 a resistance and a transistor serially connected to the output of said preamplifier and parallel with said voltage divider, said transistor receiving said D.C. bias signal at a base electrode varying the resistance of said transistor in proportion to the value of said D.C. bias signal; and
 a capacitance connecting the junction between said resistance and said transistor to an input of said attenuator means.

18. The signal limiter of claim 13 wherein said signal limiting means comprises:
 a voltage divider for generating a signal proportional to the output voltage of said preamplifier;
 means for rectifying said signal proportional to the output voltage of said preamplifier to generate a D.C. bias signal;
 a resistance and a transistor serially connected to the output of said preamplifier and parallel with said voltage divider, said transistor receiving said D.C. bias signal at a base electrode varying the resistance of said transistor in proportion to the value of said D.C. bias signal; and
 a capacitance connecting the junction between said resistance and said transistor to an input of said attenuator means.

19. The signal limiter of claim 13 further comprising amplifier means between said signal limiting means and said attenuator means.

20. The signal limiter of claim 13 further comprising amplifier means between said attenuator means and said receiver.

* * * * *

UNITED STATES PATENT AND TRADEMARK OFFICE
CERTIFICATE OF CORRECTION

PATENT NO. : 4,416,023
DATED : November 15, 1983
INVENTOR(S) : John C. Michoff

It is certified that error appears in the above-identified patent and that said Letters Patent is hereby corrected as shown below:

Column 1, line 30, after "2,498,957" insert a comma ---- , ----.

Column 2, line 29, delete "enable" and insert ---- enables ----.

Column 2, line 55, delete "coupld" and insert ---- coupled ----.

Column 3, line 7, delete "te" and insert ---- the ----.

Column 5, line 14, delete "cab" and insert ---- can ----.

Column 5, line 46, delete "the", both occurrences, and insert ---- said ----, both occurrences.

Column 5, line 56, delete "the" and insert ---- said ----.

Column 5, line 65, after "level" insert ---- responsive means ----.

Column 6, line 49, delete "claim 7" and insert ---- claim 5 ----.

Signed and Sealed this

Fifth Day of June 1984

[SEAL]

Attest:

GERALD J. MOSSINGHOFF

*Attesting Officer*  *Commissioner of Patents and Trademarks*